United States Patent [19]
McCaslin et al.

[11] Patent Number: 4,989,169
[45] Date of Patent: Jan. 29, 1991

[54] DIGITAL TONE DETECTOR USING A RATIO OF TWO DEMODULATORS OF DIFFERING FREQUENCY

[75] Inventors: Shawn R. McCaslin, Cedar Creek; Tim A. Williams; Nicholas R. van Bavel, both of Austin, all of Tex.

[73] Assignee: Motorola, Inc., Schaumburg, Ill.

[21] Appl. No.: 474,607

[22] Filed: Feb. 5, 1990

[51] Int. Cl.⁵ .............................................. G06F 15/31
[52] U.S. Cl. ................................................ 364/724.09
[58] Field of Search ...................... 364/724.09, 724.08, 364/724.01

[56] References Cited

U.S. PATENT DOCUMENTS

| | | | |
|---|---|---|---|
| 4,021,653 | 5/1977 | Sharp et al. | 364/724.09 |
| 4,297,533 | 10/1981 | Gander et al. | 364/724.09 |
| 4,484,035 | 10/1984 | Graham et al. | 364/724.08 X |
| 4,539,692 | 9/1985 | Munter | 364/724.09 X |

OTHER PUBLICATIONS

Principles of Communications, Systems, Modulation and Noise, R. E. Ziemer et al., Houghton Mifflin Compar, Second Edition (1985).
EDN, Mar. 21, 1985, "Add DTMF Generation and Decoding to DSP-uP Designs", Patrick Mock, pp. 205-220.

Primary Examiner—Dale M. Shaw
Assistant Examiner—Tan V. Mai
Attorney, Agent, or Firm—Robert L. King

[57] ABSTRACT

A digital tone detector receives a modulated input signal selectively containing at least one tone signal component. Two demodulator circuits each demodulate the input signal wherein one demodulator circuit operates at the predetermined frequency of the tone and the other demodulator circuit operates at the second harmonic. When the input tone has a low spectral harmonic power, a ratio of the demodulated outputs of the two demodulators reliably detects the presence of the tone in the input signal.

8 Claims, 2 Drawing Sheets

DIGITAL TONE DETECTOR USING A RATIO OF TWO DEMODULATORS OF DIFFERING FREQUENCY

FIELD OF THE INVENTION

This invention relates generally to digital circuits, and more particularly, to digital tone detector circuits.

BACKGROUND OF THE INVENTION

Tone bursts are used in some communication networks to transmit simple, low data-rate signalling messages. A major reason for using a tone is that the required detection and generation circuitry may be relatively simple. A tone burst may be used, for example, to initiate and synchronize activation across a high data-rate network. In particular, a tone is used by a telecommunications U-interface transceiver at one end of an Integrated Services Digital Network (ISDN) U-interface node to signal to a distant end that the transceiver is requesting activation. By using a tone instead of the normal data signal using the 2B1Q line code of the U-interface transceiver, a U-interface transceiver may detect activation requests without requiring adaptive equalization or timing synchronization. Another advantage of using tones is that tones can be distinguished from cross talk and impulse noise in the U-interface, thus preventing false attenuation attempts.

An important technical characteristic of tone detectors is that the tone detector must be able to detect a transmitted tone under worst-case transmission conditions with a minimum probability of error. Known tone detectors are typically implemented in analog circuitry with components which may have varying characteristic over temperature and process changes. Tone detectors which have been implemented in digital circuitry include phase locked loop circuits, zero crossing and interval measurement circuits and circuits which threshold detect the normalized energy output of a bandpass filter. In order to guarantee reliable tone detection, a large amount of digital circuitry is typically required for these implementations.

BRIEF DESCRIPTION OF THE INVENTION

Accordingly, it is an object of the present invention to provide an improved digital tone detector and method of operation.

It is another object of the present invention to provide an improved communications system for accurately detecting a presence of a tone transmitted via a communications medium.

It is yet another object of the present invention to provide an improved circuit and method for detecting one of multiple tones transmitted via a communications network.

In carrying out these and other objects of the invention, there is provided, in one form, a method and circuit for receiving a modulated input signal which selectively contains a tone signal and provides an output signal which indicates a detection of the tone signal. A first portion receives the modulated input signal and demodulates the input signal at a first predetermined frequency. A second portion is coupled to the first portion for receiving the modulated input signal and demodulating the input signal at a second predetermined frequency. A third portion is coupled to both the first and second portions for providing an output signal which indicates when the tone signal is detected. The third portion functions as a detector that tests whether a ratio of two input signals is greater than a predetermined threshold value.

These and other objects, features and advantages will be more clearly understood from the following detailed description taken in conjunction with the accompanying drawings.

DETAILED DESCRIPTION OF THE INVENTION

Figure 1:
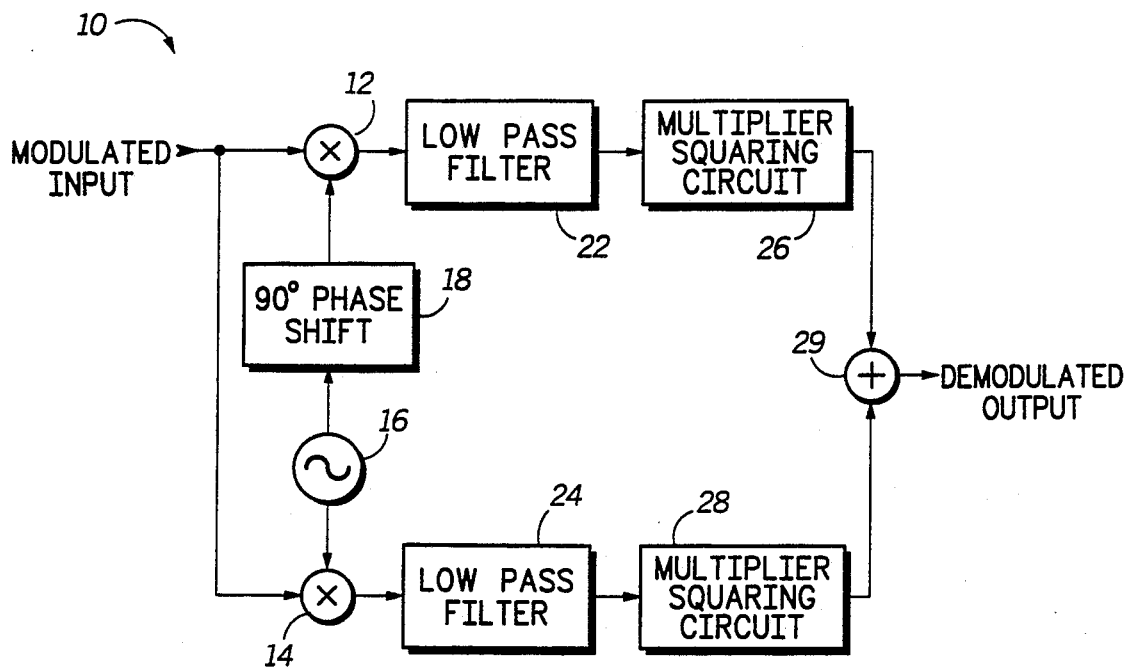
FIG. 1 illustrates in block diagram form a known digital demodulator circuit.

Shown in FIG. 1 is a known digital demodulator circuit 10. A digital modulated input signal is connected to a first input of both a multiplier 12 and a multiplier 14. A sinusoidal signal generator 16 has an output connected to both a second input of multiplier 14 and an input of a ninety degree phase shift circuit 18. An output of the phase shift circuit 18 is connected to a second input of multiplier 12. An output of multiplier 12 is connected to an input of a low pass filter 22, and an output of multiplier 14 is connected to an input of a low pass filter 24. An output of low pass filter 22 is connected to a multiplier squaring circuit 26, and an output of low pass filter 24 is connected to a multiplier squaring circuit 28. An output of multiplier squaring circuit 26 is connected to a first input of an adder 29, and an output of multiplier squaring circuit 28 is connected to a second input of an adder 29. An output of adder 29 provides a digital demodulated output signal.

In general, a demodulator is a standard digital signal processing tool which is used to shift the frequency content of a signal. Multipliers 12 and 14 function to multiply the two quadrature phase sinusoidal signals of a predetermined frequency and the modulated input signal. Phase shift circuit 44 is utilized to provide the ninety degree phase difference for the two quadrature phase sinusoidal signals. Low pass filters 22 and 24 need to be able to eliminate harmonics generated by multipliers 12 and 14 which form the Sine and Cosine terms. Also, low pass filters 22 and 24 filter noise which may exist. However, in order to eliminate the most noise, low pass filters 22 and 24 must have a narrow bandwidth. But the more narrow a frequency range which is chosen, the greater the complexity of the filter becomes. Also, a narrow band low pass filter has more delay associated with its output. Also, the duration of an input tone pulse restrains the bandwidth of the filter. In particular, the shorter a tone pulse is, the wider the bandwidth of the filter must be. Therefore, there are several features and advantages which are desired in the filter which can only be obtained individually and not collectively. In practice, a significant amount of high frequency signal components may not be filtered and may be coupled to each of the multiplier squaring circuits 26 and 28. When a demodulated input signal is present at the inputs of multipliers 12 and 14, the output of demodulator 10 is a signal of predetermined amplitude. Disadvantages associated with demodulator 10 include the fact that since low pass filters 22 and 24 are non-ideal and actually pass noise and higher frequency components, a varying and uncertain amplitude of the output signal may result. In addition, at least four multiply operations are required to implement the illustrated functions and multiplies typically require an undesirably large amount of complexity.

Figure 2:
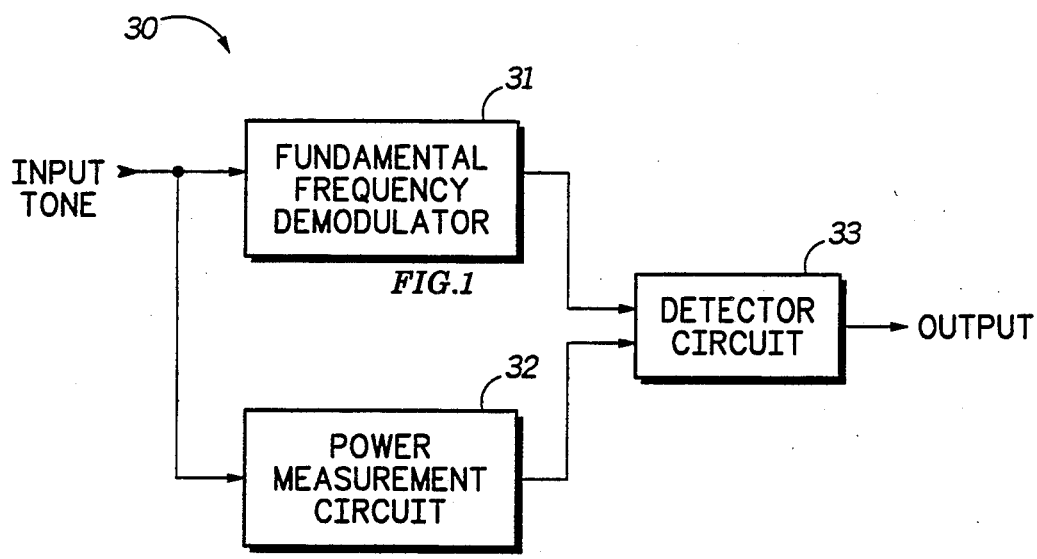
FIG. 2 illustrates in block diagram form a known tone detector circuit.

Shown in FIG. 2 is a known tone detector 30 generally comprising a demodulator 31, such as demodulator 10 of FIG. 1, a power measurement circuit 32 and a detector circuit 33. Demodulator 31 operates at a fundamental frequency of a tone which is desired to be detected. An input tone is connected to an input terminal of both demodulator 31 and power measurement circuit 32. An output of demodulator 31 is connected to a first input of detector circuit 33, and an output of power measurement circuit 32 is connected to a second input of detector circuit 33. An output of detector circuit 33 provides a signal which indicates when a predetermined tone is actually received by tone detector 30.

Tone detector 30 functions by using frequency demodulator 31 to demodulate at a predetermined frequency a modulated input signal in the form of a tone. The demodulated output is connected to detector circuit 33. Also, the spectral power of the modulated input signal is measured by circuit 32 at all frequencies. Detector circuit 33 functions to compare the outputs of demodulator 31 and circuit 32 and can determine when a tone is present at the predetermined fundamental frequency by comparing the difference in magnitude of the outputs of demodulator 31 and circuit 32. In order to detect a presence of an input tone, detector circuit 33 must have a predetermined energy threshold value from which to determine whether or not an input tone exists. The threshold value is often difficult to select because a value which is sufficiently insensitive to noise but not insensitive to an input tone must be chosen. As a result, reliable tone detection is not always assured.

Figure 3:
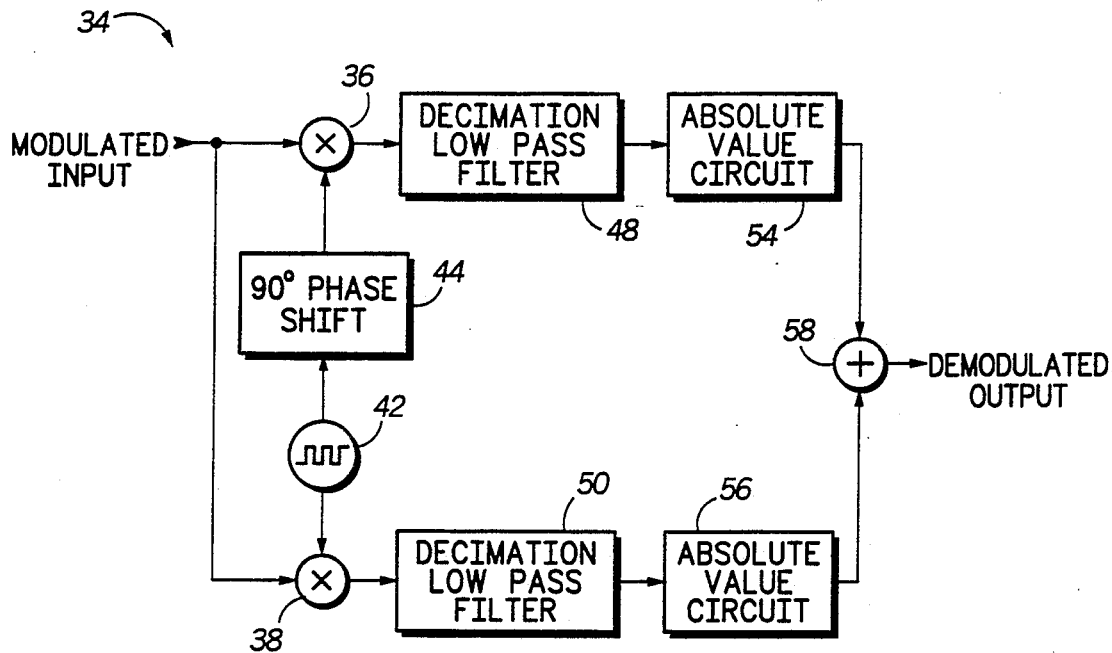
FIG. 3 illustrates in block diagram form a digital demodulator circuit for use with the present invention.

Shown in FIG. 3 is a digital demodulator circuit 34 having simpler circuitry than demodulator 10 of FIG. 1 as will be discussed below. A digital modulated input is connected to a first input of both a multiplier 36 and a multiplier 38. A square wave signal generator 42 has a first output for providing an in-phase signal connected to a second input of multiplier 38 and a second output connected to a first input of a ninety degree phase shift circuit 44. An output of phase shift circuit 44 provides a quadrature phase signal and is connected to a second input of multiplier 36. An output of multiplier 36 is connected to an input of a decimation low-pass filter 48, and an output of multiplier 38 is connected to an input of a decimation low-pass filter 50. An output of decimation low-pass filter 48 is connected to an input of an absolute value circuit 54, and an output of decimation low-pass filter 50 is connected to an input of an absolute value circuit 56. An output of absolute value circuit 54 is connected to a first input of an adder 58, and an output of absolute value circuit 56 is connected to a second input of adder 58. An output of adder 58 provides a demodulated output signal.

In operation, demodulator 34 implements the sum of the absolute values of the in-phase and quadrature phase signals. A square wave signal generator is used in demodulator 34 instead of a sinusoidal signal generator. Demodulator 34 also functions to provide an output signal of predetermined amplitude when a modulated input signal is connected to the first inputs of multipliers 36 and 38. The amplitude of the output signal of demodulator 34 indicates an amount of signal power in the vicinity of a predetermined input frequency. It should be especially noted that because a square wave generator 42 is used, multipliers 36 and 38 can be implemented with simple multiplier circuits since the square wave signal is either plus one or minus one. Therefore, the signal which is connected to each of multipliers 36 and 38 functions as a conditional complementer signal to conditionally complement the other input of each of multipliers 36 and 38. To implement this circuit function, fundamental logic circuitry may be utilized to implement the function of multipliers 36 and 38. In one form, each of multipliers 36 and 38 may be implemented by a two-input logic gate for each input bit having a first input connected to a predetermined input bit and a second input connected to the square wave. It should be noted that the use of a square wave to form the in-phase and quadrature phase terms results in less noise rejection at odd harmonic frequencies in the outputs of multipliers 36 and 38. Effects of this operating characteristic however may be minimized in the present invention as discussed below. Therefore, the multiplier circuits 12 and 14 required in demodulator 10 of FIG. 1 have been replaced in demodulator 34 of FIG. 3 with simpler and smaller circuitry while implementing a multiplication function.

In the illustrated form of demodulator 34, a multi-rate decimation low-pass filter is used to provide a simple average of each of the outputs of multipliers 36 and 38. The outputs of multipliers 36 and 38 are decimated from a higher sampling rate to a lower sampling rate, and an average of the digital signals is then implemented. The disadvantage of using an average instead of a more complex FIR or an IIR filter is a reduction in filtering effectiveness. Again, the present invention discussed below may be utilized to minimize the effects of this characteristic. The use of an absolute value circuit rather than a multiplier squaring circuit introduces input signal phase sensitivity into the demodulator's operation. However, as discussed below, this circuit characteristic is insignificant where the power of the tone fundamental is significantly higher than the power at the second harmonic. Demodulator 34 has the advantage of not requiring any multiplies and using smaller, simpler circuitry than demodulator 10.

Figure 4:
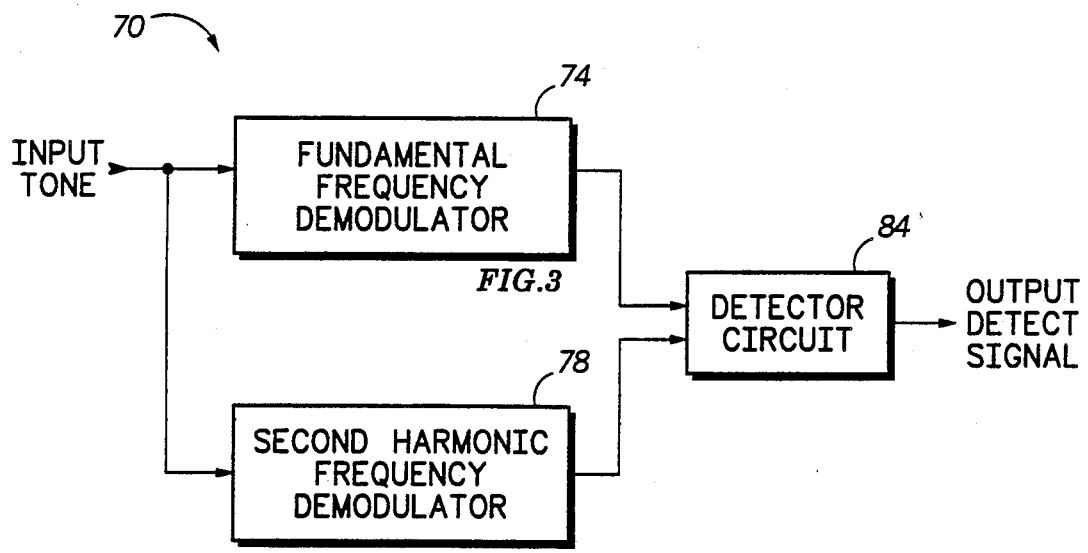
FIG. 4 illustrates in block diagram form a tone detector circuit in accordance with the present invention.

Shown in FIG. 4 is a tone detector 70 in accordance with the present invention. An input signal having at least one tone component is connected to an input of both a fundamental frequency demodulator 74 and a second harmonic frequency demodulator 78. An output of fundamental frequency demodulator 74 is connected to a first input of a detector circuit 84, and an output of second harmonic frequency demodulator 78 is connected to a second input of detector circuit 84. An output of detector circuit 84 provides an output detect signal.

In operation, tone detector 70 functions to receive a signal selectively having one or more tones and detects the receipt of a particular tone. Each of frequency demodulators 74 and 78 may be implemented by demodulator 34 of FIG. 2 wherein demodulator 74 is focussed at a fundamental tone frequency and demodulator 78 is focussed at a different tone frequency which may either be greater or less than the fundamental tone frequency. In one form, demodulator 78 may be focussed at a harmonic of frequency which demodulator 74 is focussed at. In the illustrated form, demodulator 78 is tuned to the the second harmonic of the predetermined fundamental tone frequency. An operating assumption is made which allows the demodulation at two different frequencies to be useful in detecting the presence of a tone. In particular, when an ideal square wave has exactly a fifty percent duty cycle, the signal has no spectral power at the second harmonic frequency or other even harmonic frequencies. Therefore, a difference in spectral power between the fundamental and second harmonic frequency should be noticeably large.

As illustrated, the outputs of demodulators 74 and 78 are ratioed, and the result is compared to a threshold signal value to detect whether or not a tone is present. A tone's fundamental frequency power is detected by detector circuit 84 which evaluates a ratio of the outputs of demodulators 74 and 78. In one form, when an output of fundamental frequency demodulator 74 is sufficiently larger than the output of the second harmonic demodulator 78, the ratio exceeds a predetermined value indicating the presence of the input tone. In order for demodulator 34 to optimally function in tone detector 70, several circuit assumptions must be made. As previously mentioned, an input signal having a very accurate duty cycle which is near fifty percent should be used. When a signal having substantially a fifty percent duty cycle is used, minimal harmonic power exists in the output of demodulator 74 at the second harmonic frequency. Secondly, an input signal having an accurate and well controlled fundamental frequency is required. Under this circuit condition, the frequency range of the fundamental frequency is clearly distinct and separate from the frequency range of any harmonics. Thirdly, the fundamental and second harmonic frequencies must be distinct from any other frequencies of signals which may be present at the input of tone detector circuit 70. The degree to which an input signal conforms to the assumed signal characteristics will determine the performance of tone detector 70. In particular, the three described restraints are particularly nonlimiting in systems subject to board-band noise, noise uncorrelated with the tone harmonics or in systems that must identify several different harmonically unrelated tones. These three criteria may be generally sufficiently met by a square wave input tone which is generated by a crystal-controlled digital system.

By using the design of demodulator 34 in tone detector circuit 70, a very accurate tone detector is provided with a minimum amount of circuitry. In particular, complex multiplier circuitry and digital filters are avoided and replaced with circuitry which is both simpler and more accurate. It should be well understood that the present invention may be used to detect a predetermined tone in connection with modulated input signals having more than one tone signal such as in dual tone multi-frequency (DTMF) systems.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A tone detector circuit for receiving a modulated input signal which selectively contains a tone signal and providing an output signal which indicates a detection of the tone signal, said tone detector circuit comprising:

a first demodulator circuit having an input for receiving the modulated input signal and demodulating the input signal at a first predetermined frequency to provide a first control signal at an output terminal;

a second demodulator circuit having an input for also receiving the modulated input signal and demodulating the input signal at a second predetermined frequency which is different than the first predetermined frequency to provide a second control signal at an output terminal; and a detector circuit coupled to the output terminals of the first and second demodulators for respectively receiving the first and second control signals and providing the output signal indicating detecting the tone signal in response to detecting a ratio of the first and second control signals falling within a predetermined range of values.

2. The tone detector circuit of claim 1 wherein said first and second demodulator circuits are each a digital frequency modulator circuit and said second predetermined frequency is a harmonic of the first predetermined frequency.

3. The tone detector circuit of claim 1 wherein said first and second demodulator circuits are each a digital frequency modulator circuit and said second predetermined frequency is not harmonically related to the first predetermined frequency.

4. The tone detector circuit of claim 1 wherein said first and second demodulator circuits are each a digital frequency modulator circuit and said second predetermined frequency is less than the first predetermined frequency.

5. The tone detector circuit of claim 1 wherein said first and second demodulator circuits are each a digital frequency modulator circuit and said second predetermined frequency is a second harmonic of the first predetermined frequency.

6. The tone detector circuit of claim 1 wherein each of said first and second demodulator circuits comprises:

a square wave signal generator for providing a square wave signal having a predetermined frequency and duty cycle;

a phase shift circuit coupled to the square wave signal generator for shifting the square wave signal a predetermined phase and providing a phase shifted square wave signal;

first logic means coupled to the square wave signal generator for implementing a multiplication function of the shifted square wave signal and the modulated input signal to provide a first output signal;

second logic means coupled to the phase shift circuit for implementing a multiplication function of the phase shifted square wave signal and the modulated input signal to provide a second output signal;

first decimation low pass filtering means coupled to the first logic means for receiving the first output signal and providing a first integrated signal;

second decimation low pass filtering means coupled to the second logic means for receiving the second output signal and providing a second integrated signal;

first arithmetic circuit means coupled to the first integrator means for receiving the first integrated signal and providing a first absolute value signal which is an absolute value of the first integrated signal;

second arithmetic circuit means coupled to the second integrator means for receiving the second integrated signal and providing a second absolute value signal which is an absolute value of the second integrated signal; and an adder coupled to the first and second arithmetic circuit means for adding the first and second absolute value signals to provide the demodulated output.

7. A tone detector circuit for receiving a modulated input signal which selectively contains a tone signal and providing an output signal which indicates a detection of the tone signal, said tone detector circuit comprising:

first and second means for receiving the modulated input signal and demodulating the input signal at both a first predetermined frequency and a second predetermined frequency which differs from the first predetermined frequency, each of said first and second means comprising:

a square wave signal generator for providing a square wave signal having a predetermined frequency and duty cycle;

a phase shift circuit coupled to the square wave signal generator for shifting the square wave signal a predetermined phase and providing a phase shifted square wave signal;

first logic means coupled to the square wave signal generator for implementing a multiplication function of the shifted square wave signal and the modulated input signal to provide a first output signal;

second logic means coupled to the phase shift circuit for implementing a multiplication function of the phase shifted square wave signal and the modulated input signal to provide a second output signal;

first decimation filtering means coupled to the first logic means for receiving the first output signal and providing a first integrated signal;

second decimation filtering means coupled to the second logic means for receiving the second output signal and providing a second integrated signal;

first arithmetic circuit means coupled to the first decimation filtering means for receiving the first integrated signal and providing a first absolute value signal which is an absolute value of the first integrated signal;

second arithmetic circuit means coupled to the second decimation filtering means for receiving the second integrated signal and providing a second absolute value signal which is an absolute value of the second integrated signal; and an adder coupled to the first and second arithmetic circuit means for adding the first and second absolute value signals to provide a demodulated output; and a detector circuit coupled to the adder of each of the first and second means for detecting when a ratio of the demodulated outputs of the first and second means exceeds a predetermined value and providing the output signal in response thereto.

8. The tone detector circuit of claim 7 wherein the second predetermined frequency is a harmonic of the first predetermined frequency.

* * * * *